(12) United States Patent
Sanchez et al.

(10) Patent No.: US 7,138,868 B2
(45) Date of Patent: Nov. 21, 2006

(54) METHOD AND CIRCUIT FOR TRIMMING A CURRENT SOURCE IN A PACKAGE

(75) Inventors: Stephen J. Sanchez, Tucson, AZ (US);
Daryl Hiser, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 137 days.

(21) Appl. No.: 10/917,189

(22) Filed: Aug. 11, 2004

(65) Prior Publication Data
US 2006/0033572 A1 Feb. 16, 2006

(51) Int. Cl.
*H03F 3/45* (2006.01)
(52) U.S. Cl. ...................... 330/256; 330/252
(58) Field of Classification Search ............... 327/541, 327/543; 330/256, 252, 269
See application file for complete search history.

(56) References Cited
U.S. PATENT DOCUMENTS

| | | | |
|---|---|---|---|
| 5,506,541 A * | 4/1996 | Herndon .................... | 327/541 |
| 6,445,245 B1 * | 9/2002 | Schultz et al. .............. | 327/541 |
| 6,583,740 B1 | 6/2003 | Schofield et al. | |
| 6,614,305 B1 | 9/2003 | Ivanov et al. | |
| 6,628,169 B1 | 9/2003 | Ivanov et al. | |

* cited by examiner

*Primary Examiner*—Henry Choe
(74) *Attorney, Agent, or Firm*—W. James Brady, III; Frederick J. Telecky, Jr.

(57) ABSTRACT

A method and circuit for trimming a current source packaged with a device can facilitate trimming of the current source without the need for additional pins or dual function pins, resulting in improved accuracy and/or simplified trimming techniques. An exemplary packaged device is configured with a trimming circuit comprising a current trimming network and a coupling circuit. An exemplary packaged device can comprise any op amp, current or voltage reference, and/or sensor device, and is configured with one or more monitor inputs. An exemplary current trimming network comprises a variable current source and a reference current source, wherein a magnitude of the variable current source can be compared to the magnitude of the reference current source. An exemplary coupling circuit is coupled between the current trimming network and the device and is configured for enabling and disabling connection of an output of the current trimming network and a monitor input of the device. During an exemplary trimming method, the variable current source is configured with a magnitude adjusted to a desired proportion of a magnitude of the reference current source, with the current trimming network configured to produce a current proportional to the difference, sum, or product of the first and second current sources.

31 Claims, 4 Drawing Sheets

METHOD AND CIRCUIT FOR TRIMMING A CURRENT SOURCE IN A PACKAGE

FIELD OF INVENTION

The present invention relates to the trimming of a device. More particularly, the present invention relates to a method and circuit for trimming a current source within a package with a device, such as operational amplifiers, reference, temperature sensor and other like devices.

BACKGROUND OF THE INVENTION

The demand for higher performance, amplifier, reference and sensor devices for use in communication, instrumentation and processing applications continues to increase. For example, designers and manufactures of such applications are requiring for the accuracy of the components and devices, such as operational amplifiers ("op amps"), current and voltage references, and temperature sensors and the like, to be continually improved to meet the higher performance requirements of a myriad of emerging audio, video, imaging and wireless applications.

Op amps, references, sensors and other similar types of devices typically are varied and adjusted through trimming techniques to improve the precision and accuracy of the devices. In many instances, a current source within such devices is trimmed at the wafer level before packaging in which extra pads are utilized. After packaging trimming requires a different technique. For example, with reference to an electronic package 100 illustrated in FIG. 1, a current source 102 needs to be trimmed after being packaged with a device, such as an op amp 104. Monitoring the progress of the trimming process requires sensing a change in the magnitude of the trimmed current source 102.

One method for sensing a change in the magnitude of the trimmed current source is to steer a replica of the trimmed current to an additional package pin, i.e., in addition to the ground GND, power PWR, and input/output pins, and then externally monitor the current. Requiring an additional pin is less desirable in modern micro-sized packaged devices.

Another method for monitoring the progress of the trimming process, implemented without the need for an extra package pin, includes the creation of a dual function on an existing package pin. For example, with reference to an electronic package 200 illustrated in FIG. 2, a dual function pin DUAL is configured for providing a positive terminal to an op amp 204 as well as for delivering a replica of current from a current source 202 to an external measurement system. While such a technique is conducted without the need for an extra package pin, the technique is susceptible to measurement errors. For example, if the target value of the adjusted current source is sufficiently small, any leakage current, such as from a switch circuit 206 or from an electro-static discharge (ESD) protection circuit, can alter the value of the replica current delivered to dual function pin DUAL. As a result, an error is added to the measurements resulting in a reduced accuracy in the trimming technique.

SUMMARY OF THE INVENTION

In accordance with various aspects of the present invention, a method and circuit for trimming a current source packaged with a device is provided. An exemplary method and circuit can facilitate trimming of the current source without the need for additional pins or dual function pins, resulting in improved accuracy and/or simplified trimming techniques.

In accordance with an exemplary embodiment, an exemplary packaged device is configured with a trimming circuit comprising a current trimming network and a coupling circuit. An exemplary packaged device can comprise any op amp, current or voltage reference, and/or sensor device and the like configured for use with a current source, and is configured with one or more monitor inputs configured for a current mode signal. An exemplary current trimming network comprises at least two current sources, with a first current source comprising a variable current source and a second current source comprising a reference current source, wherein a magnitude of the variable current source can be compared to the magnitude of the reference current source. An exemplary coupling circuit is coupled between the current trimming network and the device and is configured for enabling and disabling connection of an output of the current trimming network and a monitor input of the device.

During an exemplary trimming method, the variable current source is configured with a magnitude adjusted to a desired proportion of a magnitude of the reference current source, with the current trimming network configured to produce a current proportional to the difference, sum, or product of the first and second current sources. For example, a first measurement condition is established with the coupling circuit disabling a connection between the current trimming network and the device, and with a device parameter measured and recorded. A second measurement condition is then established with the coupling circuit enabling a connection between an output of the current trimming network and a monitor input of the device, with the device parameter again measured and then compared to the value of the device parameter in the first measurement to determine whether the desired proportion has been obtained. An iterative process is provided for incrementally adjusting the variable current source until the value of the re-measured device parameter is a desired proportion of the value of the device parameter in the first measurement condition, with the coupling circuit again disabling the connection between the current trimming network and the device.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. In addition, the present invention may be practiced in any amplifier, reference, sensor, or other electronics based application. However for purposes of illustration only, exemplary embodiments of the present invention are described herein in connection with an op amp circuit.

Further, it should be noted that while various components may be suitably coupled or connected to other components within exemplary circuits, such connections and couplings can be realized by direct connection between components, or by connection through other components and devices located therebetween. To understand the various operational sequences of the present invention, an exemplary description is provided. However, it should be understood that the following example is for illustration purposes only and that the present invention is not limited to the embodiments disclosed.

In accordance with various aspects of the present invention, a method and circuit for trimming a current source packaged with a device is provided. An exemplary method and circuit can facilitate trimming of the current source without the need for additional pins or dual function pins, resulting in improved accuracy and/or simplified trimming techniques.

Figure 1:
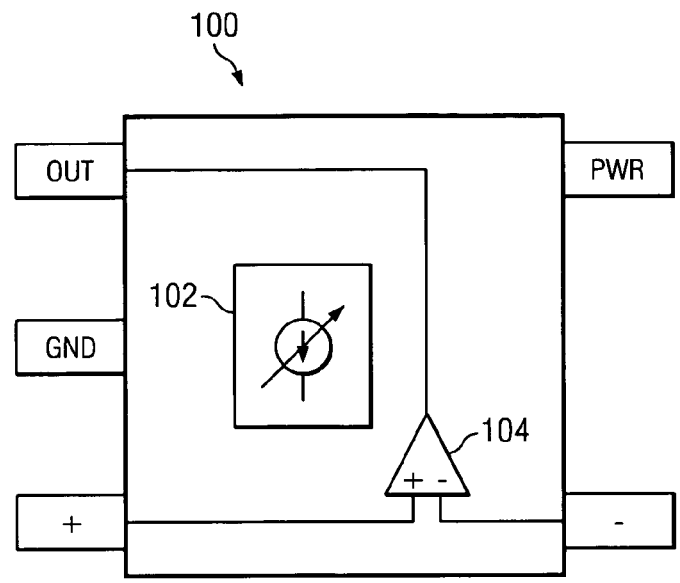
FIG. 1 illustrates a prior art packaged current source with a device.
Figure 2:
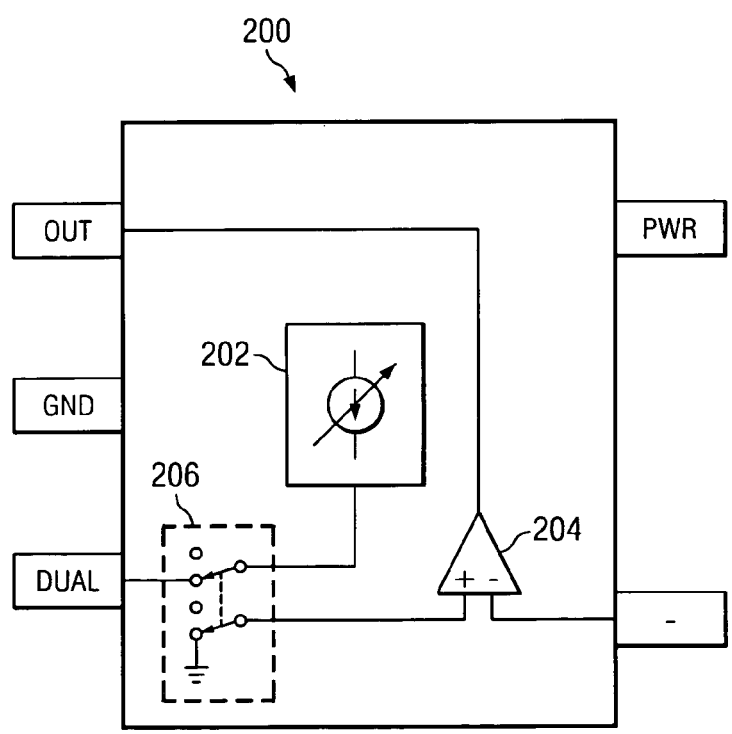
FIG. 2 illustrates a prior art packaged current source with a device with a dual function package pin.
Figure 3A:
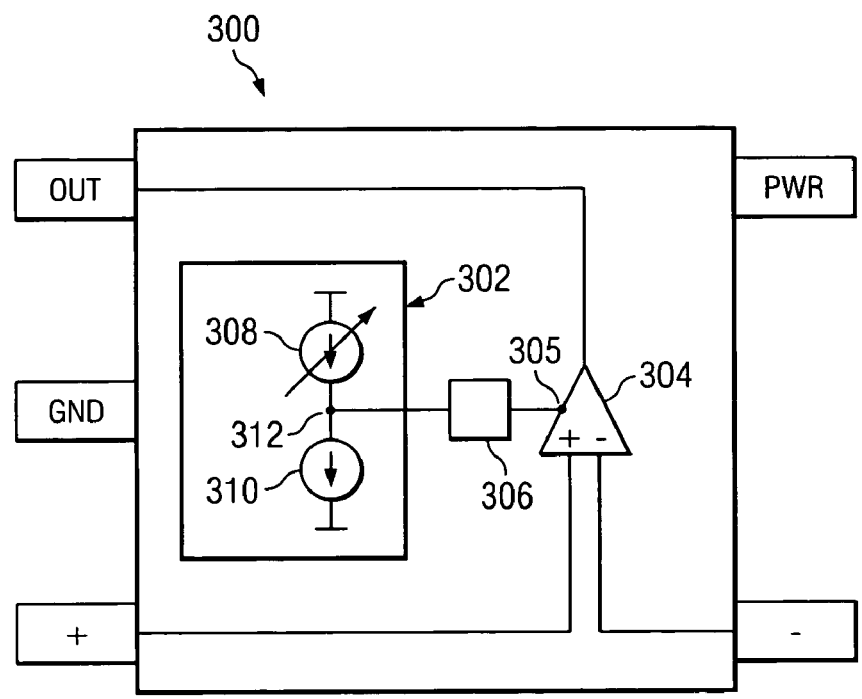
FIGS. 3A and 3B illustrate exemplary trimming circuits for a packaged device in accordance with exemplary embodiments of the present invention.

With reference to FIG. 3A, in accordance with an exemplary embodiment, an exemplary packaged circuit 300 comprises a device 304 is configured with a trimming circuit comprising a current trimming network 302 and a coupling circuit 306. Packaged device 304 comprises an op amp device having a positive terminal and a negative terminal, and output terminal, and one or more monitor inputs 305 configured for receipt of a current mode signal. Device 304 is also configured to provide one or more device parameters for measurement, such as output voltage at terminal OUT, input offset voltage at the +/− input terminals, operational bandwidth and slew rate, or any other device parameter. In addition to an op amp, device 304 can comprise any current or voltage reference, sensor device or other like device configured for use with a current source.

An exemplary current trimming network 302 comprises at least two current sources, such as a first current source 308 and a second current source 310, and at least one output. First current source 308 comprises a variable current source and second current source 310 comprises a reference current source. In this exemplary embodiment, variable current source 308 and reference current source 310 are configured in series with a junction 312 configured in between. Variable current source 308 can comprise any current source that can be varied, adjusted, and/or trimmed, while reference current source 310 can comprise any current source configuration for providing a reference current.

An exemplary current trimming network 302 comprises at least two current sources, such as a first current source 308 and a second current source 310, and at least one output. First current source 308 comprises a variable current source and second current source 310 comprises a reference current source. In this exemplary embodiment, variable current source 308 and reference current source 310 are configured in series with a junction 312 configured in between. Variable current source 308 can comprise any current source that can be varied, adjusted, and/or trimmed, while reference current source 310 can comprise any current source configuration for providing a reference current.

Current trimming network 302 is configured to enable a magnitude of variable current source 308 to be compared to a magnitude of reference current source 310, and then suitably adjust a magnitude of variable current source 308 to a desired proportion of magnitude of reference current source 310 and/or until a desired value of a device parameter for device 304 is achieved. Such a desired proportion can be unity, or any proportion greater than or less than unity. For example, in accordance with an exemplary embodiment, current trimming network 302 can be configured to provide an output current proportional to the difference of the magnitudes of current for variable current source 308 and reference current source 310. The output difference current can be suitably utilized to determine an amount of adjustment to be made to variable current source 308. For example, any difference in current ΔI between variable current source 308 and reference current source 310 can flow into and out of junction 312, suitably sinking or sourcing current into monitor input 305.

In accordance with another exemplary embodiment, current trimming network 302 can also be configured to provide an output current proportional to the sum of the magnitudes of current for variable current source 308 and reference current source 310. For example, with reference to FIG. 3B, variable current source 308 and reference current source 310 can be suitably configured in parallel. An output current that is proportional to the sum of the magnitudes of current sources 308 and 310 is provided to a first output 312 of current trimming network 302, with a second current that is a replica of the reference current from reference current source 310 being provided from a second output 314 of current trimming network 302. As a result, rather than providing a difference current at junction 312, a summation of current from both current sources 308 and 310 will be realized as an output current at a junction 312 provided to a first monitor input 305A, with a replica of the reference current from reference current source 310 being provided from an output 314 to second monitor input 305B.

In accordance with other exemplary embodiments, current trimming network 302 can also be configured to provide an output current proportional to the product of the magnitudes of current for variable current source 308 and reference current source 310. In accordance with this embodiment, for example with reference again to FIG. 3B, the output current that is proportional to the product of the magnitudes of current sources 308 and 310 is provided to a first output 312 of current trimming network 302, with a second current that is a replica of the reference current from reference current source 310 being provided to a second output 314 of current trimming network 302. In addition to the above embodiments, current trimming network 302 can also be configured to provide a variable current and reference current from variable current source 308 and reference current source 310, or replica currents thereof, to a first output and a second output of current trimming network 302.

Moreover, in addition to adjusting a magnitude of variable current source 308 to a desired proportion of magnitude of reference current source 310, current trim network 302 can also be configured for adjusting a magnitude of variable current source 308 until a desired value of a device parameter for device 304 is achieved. For example, current trim network 302 can be configured to increase or decrease a magnitude of variable current source 308 until a desired value of output voltage, input offset voltage, bandwidth and slew rate, or any other device parameter is achieved. Accordingly, current trimming network 302 can be configured in any manner for enabling a magnitude of variable current source 308 to be compared to a magnitude of reference current source 310, and for adjusting a magnitude of variable current source 308 to a desired ratio or proportion of magnitude of reference current source 310 and/or until a desired value of a device parameter for device 304 is achieved.

An exemplary coupling circuit 306 is coupled between current trimming network 302 and device 304 and is configured for enabling and disabling connection of one or more outputs of current trimming network 302 and one or more monitor inputs 305 of device 304. For example, coupling circuit 306 can be configured to steer current from junction 312 to a monitor input 305, e.g., any difference in current ΔI between variable current source 308 and reference current source 310 can flow into and out of junction 312, suitably sinking or sourcing current to and from monitor input 305. Thus, for example, if the magnitude of current for reference current source 310 is larger than the magnitude of current for variable current source 308, coupling circuit 306 can facilitate the sourcing of current from monitor input 305, and if the magnitude of current for reference current source 310 is less than the magnitude of current for variable current source 308, coupling circuit 306 can facilitate the sinking of current into monitor input 305. The respective sinking and sourcing of current to and from device 304 can suitably adjust one or more device parameters, such as output voltage, input offset voltage, bandwidth and slew rate, or any other device parameters.

Figure 8:
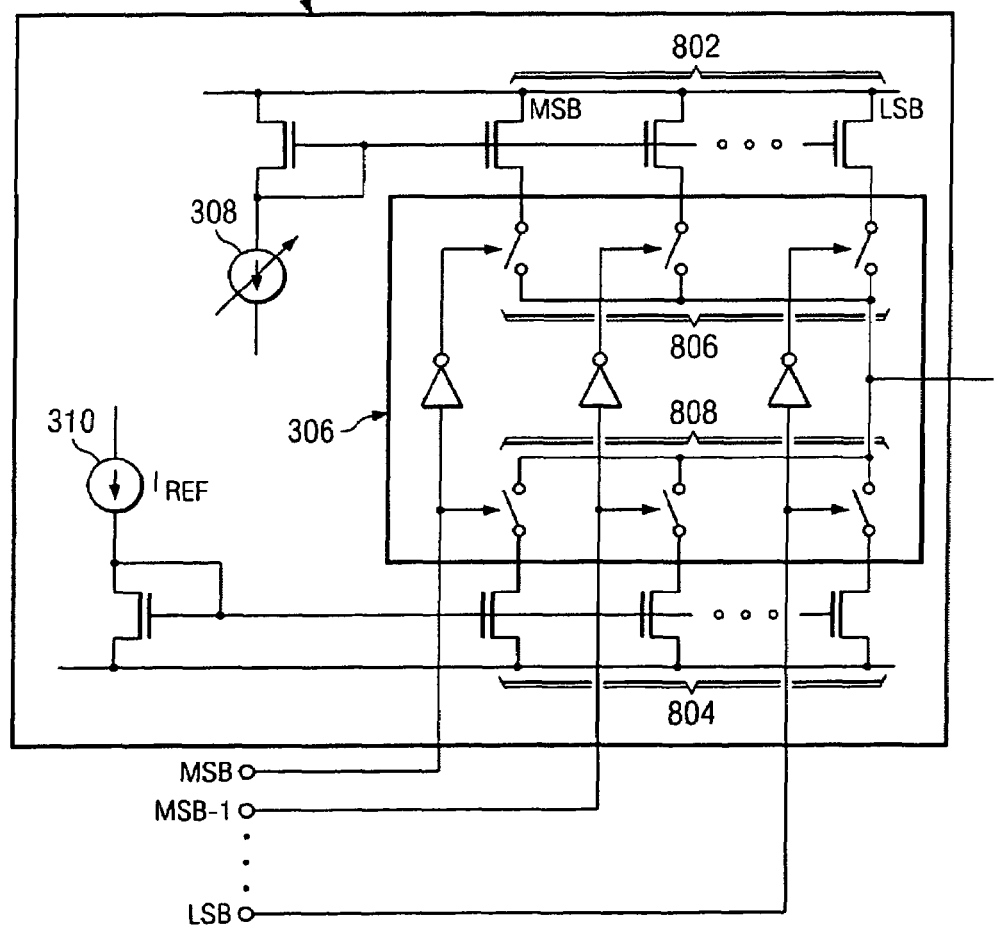
FIG. 8 illustrates a schematic diagram of an application for an exemplary trimmed current source configured with an exemplary coupling circuit in accordance with an exemplary embodiment of the present invention.

Coupling circuit 306 can suitably comprise any switching circuit or configuration, e.g., coupling circuit 306 can suitably comprise any transistor-based switching network. For example, with momentary reference to FIG. 8, in accordance with an exemplary embodiment, an exemplary coupling circuit 306 can be suitably integrated within current trimming network 302. In this exemplary embodiment, the bits MSB . . . LSB represent drift bits that may be suitably enabled through coupling circuit 306 during adjustment of variable current source 308, wherein upper transistor devices 802 can generate replicas of variable current 308, and lower transistor devices 804 can generate replicas of reference current 310. Depending on the operation of switches 806 and/or 808, a difference in the amount current from current sources 308 and 310 can be suitably determined. In addition to the exemplary embodiment illustrated in FIG. 8, coupling circuit 306 can be configured as a separate circuit apart from current trimming network 302 and device 304, or integrated as a component of current trimming network 302 or device 304. Accordingly, coupling circuit 306 can comprise any circuit configuration for enabling and disabling connections between one or more output terminals or junctions and one or more input terminals of a device.

During an exemplary trimming method, the trimming circuit is configured to adjust a magnitude of current for variable current source 308 to a desired proportion of a magnitude of reference current source 310 based on a device parameter with respect to device 304, e.g., current trimming network 302 is configured to produce a current at one or more output junctions 312 proportional to the difference, sum, or product of the values in magnitude of first and second current sources 308 and 310, and suitably adjust the magnitude of variable current source 308 until a desired parameter value is obtained.

Figure 4:
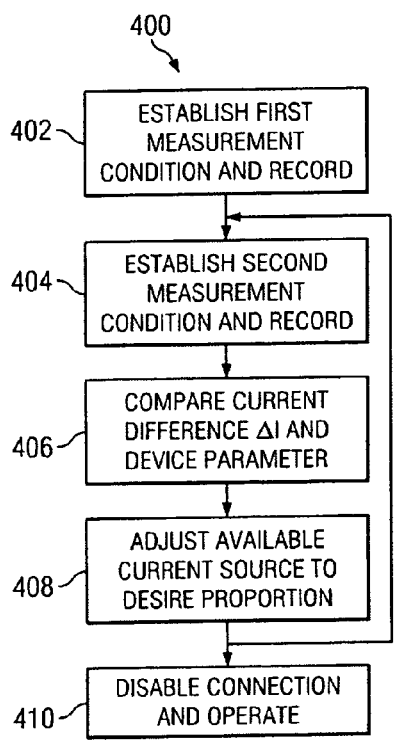
FIG. 4 illustrates a flow diagram for an exemplary trimming method in accordance with an exemplary embodiment of the present invention.

For example, in accordance with an exemplary embodiment, an exemplary trimming method is illustrated with additional reference to FIG. 4, as operated for a packaged circuit 300 illustrated in FIG. 3A. In a step 402, a first measurement condition is established with coupling circuit 306 disabling a connection between current trimming network 302 and device 304, e.g., disabling a connection between junction 312 and monitor input 305, and with a device parameter, such as input voltage offset $V_{OS}$, being measured and recorded. In a step 404, a second measurement condition is then established with the coupling circuit 306 enabling a connection between an output of current trimming network 302, e.g., junction 312, and at least one monitor input 305 of device 304, with the device parameter, such as input voltage offset $V_{OS}$, again measured.

In a step 406, the second measured value of the device parameter, i.e., the value obtained when current trim network 302 and device 304 are coupled together, is then compared to the first measured value of the device parameter to determine whether the desired proportion has been obtained and/or whether a desired value of a device parameter for device 304 is achieved. If not, an iterative process in a step 408 is provided for incrementally adjusting the value of current for variable current source 308 until the value of the re-measured device parameter converges to a desired proportion of the value of the device parameter in the first measurement condition, e.g., incrementally adjusting the value of current for variable current source 308 until the value of input voltage offset $V_{OS}$=0. Upon achieving a magnitude of variable current source 308 adjusted to a desired proportion of magnitude of reference current source 310 and/or to a desired value of a device parameter for device 304, in a step 410, coupling circuit 306 again disables the connection between current trimming network 302 and device 304, allowing device 304 to operate in normal conditions.

Figure 3B:
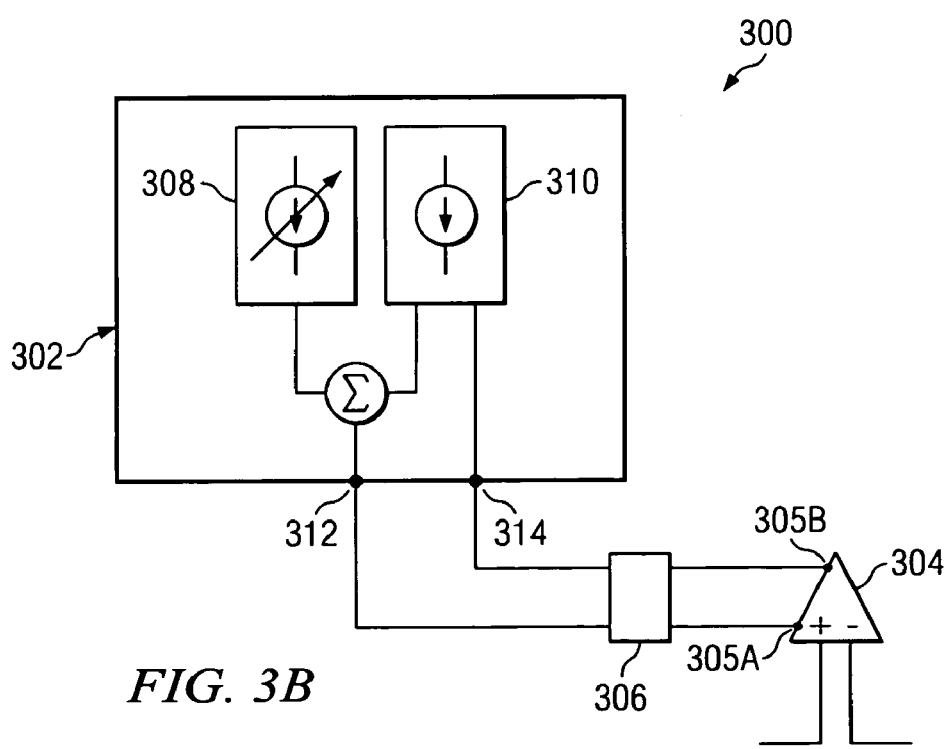
Figure 5:
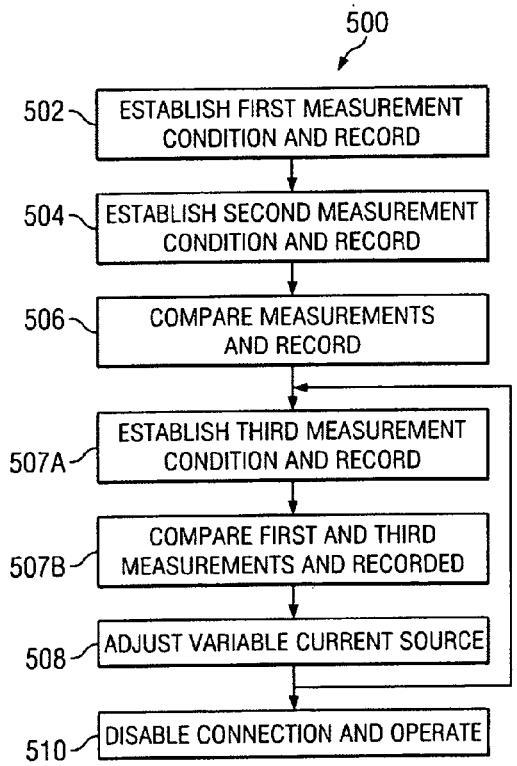
FIG. 5 illustrates a flow diagram for an exemplary trimming method in accordance with another exemplary embodiment of the present invention.

In accordance with another exemplary embodiment, an exemplary trimming method is illustrated with additional reference to FIG. 5, as operated for a packaged circuit 300 illustrated in FIG. 3B for a summation of current from variable current source 308 and reference current source 310, or for a product or other proportional value of variable current source 308 and reference current source 310. In accordance with this exemplary embodiment, in a step 502, a first measurement condition is established with coupling circuit 306 disabling a connection between current trimming network 302 and device 304, e.g., disabling a connection between first and second outputs of current trimming network 302 and monitor inputs 305A and 305B, and with a device parameter, such as input voltage offset $V_{OS}$, being measured and recorded. In a step 504, a second measurement condition is then established with the coupling circuit 306 enabling a connection between a second output of current trimming network 302, e.g., a replica of the current from reference current source 310, and second monitor input 305B of device 304, with a second measurement of the device parameter, such as input voltage offset $V_{OS}$, obtained and recorded.

In a step 506, the second measured value of the device parameter, i.e., the value obtained when the second output of current trim network 302 and monitor input 305B of device 304 are coupled together, is then compared to the first measured value of the device parameter, with the difference being recorded as a first difference value. The first difference value is proportional to the current delivered to the second monitor input 305B from the second output of current trimming network 302. Next, in a step 507A, a third measurement condition is established, wherein the connection from the second output of current trimming network 302 and second monitor input 305B are disabled by coupling circuit 306, and a connection is established between a first output of current trimming network 302, whereby the sum, product or a variable current is delivered, and second monitor input 305B to measure and record a third measurement of the device parameter. In a step 507B, the values of the first measurement and the third measurement are compared with the result recorded as a second difference value. The second difference value is proportional to the current delivered to device monitor input 305B from the first output of current trim network 302.

In a step 508, an iterative process is provided for incrementally adjusting the value of current for variable current source 308, re-measuring the device parameter while in the third measurement condition. The re-measured value of the device parameter is used to replace the recorded third measurement, with the second difference value being re-calculated until the value of the second difference value converges to a desired proportion of the first difference value. Upon achieving a magnitude of variable current source 308 adjusted such that the value of the second difference value is a desired proportion of the first difference value, in a step 410, coupling circuit 306 again disables the connection between current trimming network 302 and device 304, allowing device 304 to operate under normal conditions.

Figure 6:
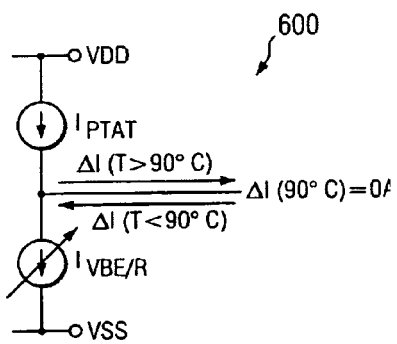
FIG. 6 illustrates a schematic diagram of an application for an exemplary trimmed current source in accordance with an exemplary embodiment of the present invention.
Figure 7:
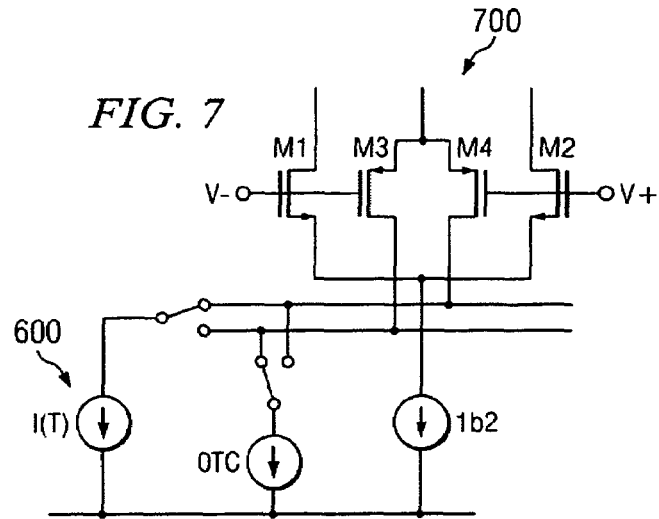
FIG. 7 illustrates a schematic diagram of an application for an exemplary trimmed current source configured within an amplifier circuit in accordance with an exemplary embodiment of the present invention.

Accordingly, an exemplary trimming method and circuit with a current trimming network can facilitate trimming of a current source packaged with a device without the need for additional pins or dual function pins, resulting in improved accuracy and/or simplified trimming techniques. In addition, such a current trimming network can be implemented within various applications for packaged devices and configurations. For example, with reference to FIG. 6, an exemplary current trimming network 600 can comprise a variable current source having a $I_{VBE/R}$-based current with a negative temperature coefficient characteristic and a reference current source having a $I_{PTAT}$-based current with a positive temperature coefficient characteristic, with current trimming network 600 being configured to suitably trim the $I_{VBE/R}$-based current to achieve a desired parameter for a device. With reference to an exemplary embodiment illustrated in FIG. 7, current trimming network 600 can thus be suitably implemented within trimming an amplifier circuit 700 configured for trimming offset and/or temperature drift in operational amplifiers and voltage references, such as that disclosed in U.S. Pat. No. 6,614,305, entitled "Method and Circuit for Trimming Offset and Temperature Drift for Operational Amplifiers and Voltage References," issued on Sep. 2, 2003, and in U.S. Pat. No. 6,628,169, entitled "Method and Circuit for Trimming Offset and Temperature Drift," issued on Sep. 30, 2003, both commonly owned by the Assignee of the present application, and both hereby incorporated by reference herein. Such trimming of an amplifier circuit 700 can occur at a second temperature without affecting any trimming conducted within an amplifier circuit at a first temperature. Various other amplifier, reference and sensor applications can also suitably implement an exemplary current trimming network of the present invention.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as varying or alternating the steps in different orders. These alternatives can be suitably selected depending upon the particular application or in consideration of any number of factors associated with the operation of the system. For example, the techniques described herein may be extended or modified for use with other types of devices, in addition to the op amp devices. These and other changes or modifications are intended to be included within the scope of the present invention.

What is claimed is:

1. A packaged circuit configured for trimming a current source within said packaged circuit, said packaged circuit comprising:
   a device having a monitor input and a measurable device parameter;
   a current trimming network comprising a variable current source, a reference constant current source and an output; and
   a coupling circuit configured for connecting said output of said trimming network to said monitor input of said device to facilitate adjustment of said variable current source;
   wherein said current trimming network is configured to enable a magnitude of said variable current source to be compared to a magnitude at said reference constant current source.

2. The packaged circuit of claim 1, wherein said device comprises one of an op amp, reference and a sensor device.

3. The packaged circuit of claim 1, wherein said device parameter comprises one of an output voltage, input voltage offset, bandwidth and slew rate of said device.

4. The packaged circuit of claim 1, wherein said current trimming network is configured to adjust said magnitude of said variable current source to a desired proportion of said magnitude of said reference constant current source.

5. The packaged circuit of claim 1, wherein said current trimming network is configured to adjust said magnitude of said variable current source until a desired value of said device parameter is achieved.

6. The packaged circuit of claim 1, wherein said current trimming network is configured to provide an output current proportional to a difference in magnitudes of said variable current source and said reference constant current source.

7. The packaged circuit of claim 6, wherein said output current proportional to said difference in magnitudes is coupled to said monitor input of said device to facilitate measurement of said device parameter.

8. The packaged circuit of claim 6, wherein said variable current source and said reference constant current source are connected in series with an output junction in between.

9. The packaged circuit of claim 1, wherein said current trimming network is configured to provide an output current proportional to at least one of a sum and a product of said magnitudes of said variable current source and said reference constant current source.

10. The packaged circuit of claim 9, wherein said current trimming network is configured to provide said proportional output current at a first output, and to provide a replica current of said reference constant current source at a second output.

11. The packaged circuit of claim 1, wherein said current trimming network is configured to provide a variable current from said variable current at a first output, and to provide a reference constant current from said reference constant current source at a second output.

12. The packaged circuit of claim 1, wherein said coupling circuit is configured for disabling a connection between said current trimming network and said device to obtain a first measurement condition for measurement of said device parameter.

13. The packaged circuit of claim 12, wherein said coupling circuit is configured for enabling a connection between said current trimming network and said device to obtain a second measurement condition for a second measurement of said device parameter.

14. The packaged circuit of claim 13, wherein said coupling circuit is configured for sourcing current from and sinking current to said monitor input.

15. A trimming circuit configured for trimming a current source packaged with a device, said trimming circuit comprising:
   a current trimming network comprising a variable current source, a reference constant current source and an output; and
   a coupling circuit configured for connecting said output of said trimming network to a monitor input of the device to facilitate adjustment of said variable current source;
   wherein said current trimming network is configured to enable a magnitude of said variable current source to be compared to a magnitude of said reference constant current source.

16. The trimming circuit of claim 15, wherein said current trimming network is configured to adjust said magnitude of said variable current source to a desired proportion of said magnitude of same reference constant current source.

17. The trimming circuit of claim 15, wherein said current trimming network is configured to adjust said magnitude of said variable current source until a desired value of a device parameter for the device is achieved.

18. The trimming circuit of claim 15, wherein said current trimming network is configured to provide an output current proportional to a difference in magnitudes of said variable current source and said reference constant current source.

19. The trimming circuit of claim 18, wherein said output current proportional to said difference in magnitudes is coupled to the monitor input of the device to facilitate measurement of a device parameter.

20. The trimming circuit of claim 18, wherein said variable current source and said reference constant current source are connected in series with an output junction in between.

21. The trimming circuit of claim 15, wherein said current trimming network is configured to provide an output current proportional to at least one of a sum and a product of said magnitudes of said variable current source and said reference constant current source.

22. The trimming circuit of claim 21, wherein said current trimming network is configured to provide said proportional output current at a first output, and to provide a replica current of said reference constant current source at a second output.

23. The trimming circuit of claim 15, wherein said current trimming network is configured to provide a variable current from said variable current at a first output, and to provide a reference constant current from said reference constant current source at a second output.

24. The trimming circuit of claim 15, wherein said coupling circuit is configured for disabling a connection between said current trimming network and the device to obtain a first measurement condition for measurement of a device parameter.

25. The trimming circuit of claim 24, wherein said coupling circuit is configured for enabling a connection between said current trimming network and the device to obtain a second measurement condition for a second measurement of the device parameter.

26. A method for trimming a current source in a packaged device, said method comprising:
   establishing a first measurement condition by disabling a connection between a current trimming network and said packaged device and recording a first measurement of a device parameter;
   establishing a second measurement condition by enabling a connection between an output of said current trimming network and a monitor input of said packaged device and recording a second measurement of a device parameter;
   comparing said first measurement of a device parameter with said second measurement of a device parameter; and
   iteratively adjusting a variable current source within said current trimming network until a desired value of said device parameter is achieved.

27. The trimming method of claim 26, wherein said establishing a second measurement condition comprises enabling a connection between a second output of said current trimming network comprising a replica of a reference current and a second monitor input of said packaged device.

28. The trimming method of claim 27, wherein prior to iteratively adjusting a variable current source, said method further comprises recording a first difference value comprising a difference between said first measurement of a device parameter with said second measurement of a device parameter.

29. The trimming method of claim 28, wherein prior to iteratively adjusting a variable current source, said method further comprises establishing a third measurement condition by enabling a connection between a first output of said current trimming network, said first output comprising at least one of a sum of a variable current and a reference current, a product of said variable current and said reference current, and a variable current, and a second monitor input of said packaged device and recording a third measurement of a device parameter.

30. The trimming method of claim 29, wherein prior to iteratively adjusting a variable current source, said method further comprises recording a second difference value comprising a difference between said first measurement of a device parameter with said third measurement of a device parameter.

31. The trimming method of claim 30, wherein said iteratively adjusting a variable current source within said current trimming network comprises re-measuring said device parameter while in said third measurement condition, recalculating said second difference value, and adjusting said variable current source until said second difference value converges to a desired proportion of said first difference value.

* * * * *